United States Patent
Krassowski et al.

(10) Patent No.: US 7,108,055 B2
(45) Date of Patent: Sep. 19, 2006

(54) OPTIMIZED HEAT SINK USING HIGH THERMAL CONDUCTING BASE AND LOW THERMAL CONDUCTING FINS

(75) Inventors: Daniel W. Krassowski, Columbia Station, OH (US); Gary G. Chen, Parma, OH (US)

(73) Assignee: Advanced Energy Technology Inc., Wilmington, DE (US)

( * ) Notice: Subject to any disclaimer, the term of this patent is extended or adjusted under 35 U.S.C. 154(b) by 0 days.

(21) Appl. No.: 10/744,309

(22) Filed: Dec. 22, 2003

(65) Prior Publication Data

US 2004/0177947 A1  Sep. 16, 2004

Related U.S. Application Data

(63) Continuation-in-part of application No. 10/113,381, filed on Mar. 29, 2002, now abandoned.

(51) Int. Cl.
*F28F 7/00* (2006.01)
*H05K 7/20* (2006.01)

(52) U.S. Cl. ............ 165/185; 165/80.3; 165/905; 361/703; 361/704

(58) Field of Classification Search .......... 165/185, 165/80.3, 905; 361/697, 703, 704, 709; 174/16.3; 257/720, 722
See application file for complete search history.

(56) References Cited

U.S. PATENT DOCUMENTS

| | | | |
|---|---|---|---|
| 3,404,061 A | 10/1968 | Shane et al. ............ 161/125 |
| 4,356,864 A * | 11/1982 | Ariga et al. ............ 165/80.3 |
| 4,895,713 A | 1/1990 | Greinke et al. ............ 423/448 |
| 5,175,668 A * | 12/1992 | Kendel ............ 361/720 |
| 5,304,846 A * | 4/1994 | Azar et al. ............ 257/722 |
| 5,315,480 A * | 5/1994 | Samarov et al. ............ 361/705 |
| 5,902,762 A | 5/1999 | Mercuri et al. ............ 501/99 |
| 6,097,598 A * | 8/2000 | Miyahara et al. ............ 361/704 |
| 6,367,152 B1 * | 4/2002 | Kataoka ............ 29/890.03 |
| 6,374,490 B1 * | 4/2002 | Miyahara ............ 29/890.03 |
| 6,422,307 B1 * | 7/2002 | Bhatti et al. ............ 165/185 |
| 6,482,520 B1 | 11/2002 | Tzeng ............ 428/408 |
| 6,680,015 B1 | 1/2004 | McCullough ............ 264/105 |

FOREIGN PATENT DOCUMENTS

| | | | |
|---|---|---|---|
| JP | 2001108773 A | * | 4/2001 |
| WO | WO/09606321 | * | 2/1996 |
| WO | WO 00/64808 | | 11/2000 |
| WO | WO 03/020510 | | 3/2003 |
| WO | WO 03/052340 | | 6/2003 |

OTHER PUBLICATIONS

Cool Shield Inc, Mar. 20, 2002, WWW.coolshieldinc.com, Data sheet 108A.*

* cited by examiner

*Primary Examiner*—Tho Duong
(74) *Attorney, Agent, or Firm*—Waddey & Patterson; James R. Cartiglia

(57) ABSTRACT

An optimized design for a composite heat sink is provided utilizing a high thermal conducting base and low thermal conducting fins. The base preferably is constructed from anisotropic graphite material, and the fins are preferably constructed from a thermally conductive plastic material. In the case of a low profile heat sink having a fin height of no greater than about 3 times that of the base, the composite construction provides superior cooling yet lighter weight as compared to a conventional all-aluminum heat sink of the same dimensions.

3 Claims, 1 Drawing Sheet

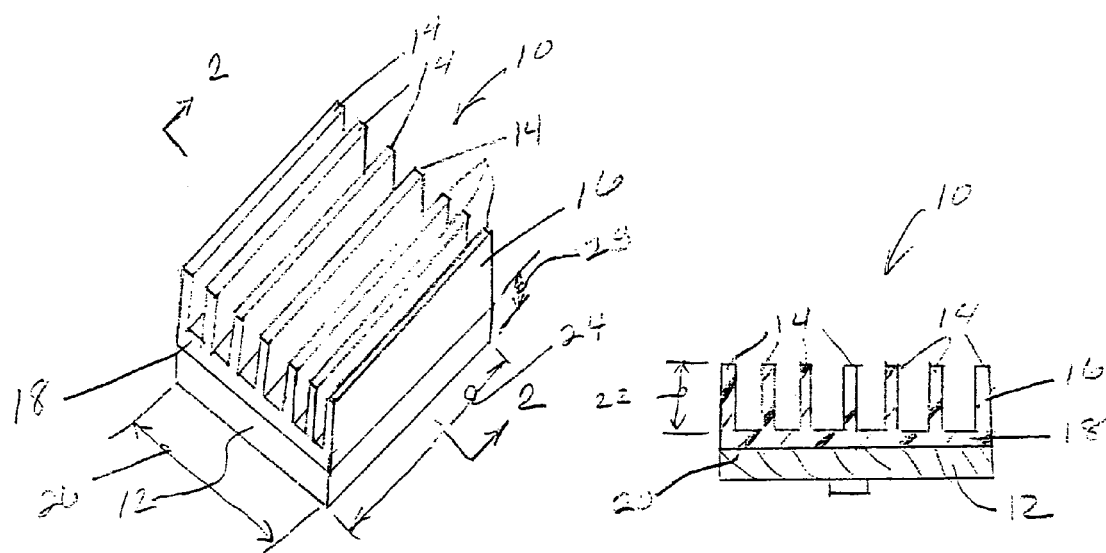
FIG. 1
FIG. 2
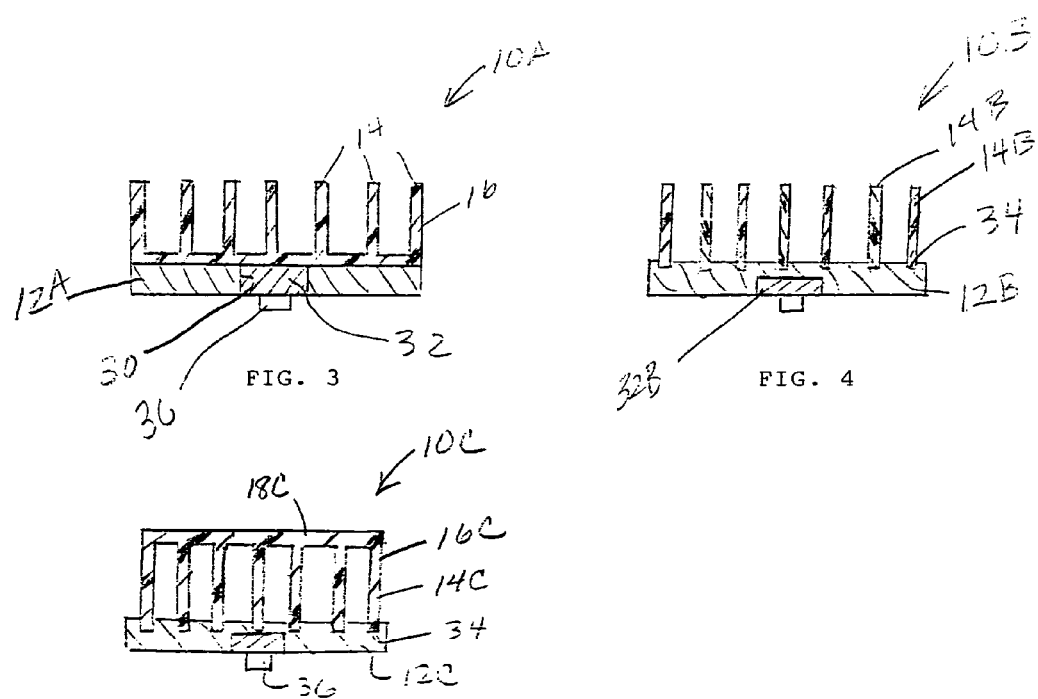
FIG. 3
FIG. 4
FIG. 5

OPTIMIZED HEAT SINK USING HIGH THERMAL CONDUCTING BASE AND LOW THERMAL CONDUCTING FINS

RELATED APPLICATION

This application is a continuation-in-part of and commonly assigned U.S. patent application having Ser. No. 10/113,381, filed Mar. 29, 2002, now abandoned the disclosure of which is incorporated herein by reference.

TECHNICAL FIELD

The present invention relates to a heat sink capable of managing the heat from a heat source such as an electronic device.

BACKGROUND OF THE INVENTION

With the development of more and more sophisticated electronic devices, including those capable of increasing processing speeds and higher frequencies, having smaller size and more complicated power requirements, and exhibiting other technological advances, such as microprocessors and integrated circuits in electronic and electrical components and systems as well as in other devices such as high power optical devices, relatively extreme temperatures can be generated. However, microprocessors, integrated circuits and other sophisticated electronic components typically operate efficiently only under a certain range of threshold temperatures. The excessive heat generated during operation of these components can not only harm their own performance, but can also degrade the performance and reliability of the overall system and can even cause system failure. The increasingly wide range of environmental conditions, including temperature extremes, in which electronic systems are expected to operate, exacerbates the negative effects of excessive heat.

With the increased need for heat dissipation from microelectronic devices, thermal management becomes an increasingly important element of the design of electronic products. Both performance reliability and life expectancy of electronic equipment are inversely related to the component temperature of the equipment. For instance, a reduction in the operating temperature of a device such as a typical silicon semiconductor can correspond to an increase in the processing speed, reliability and life expectancy of the device. Therefore, to maximize the life-span and reliability of a component, controlling the device operating temperature within the limits set by the designers is of paramount importance.

Several types of heat dissipating components are utilized to facilitate heat dissipation from electronic devices. The present invention is directly applicable to finned heat sinks.

These heat sinks facilitate heat dissipation from the surface of a heat source, such as a heat-generating electronic device, to a cooler environment, usually air. The heat sink seeks to increase the heat transfer efficiency between the electronic device and the ambient air primarily by increasing the surface area that is in direct contact with the air or other heat transfer media. This allows more heat to be dissipated and thus lowers the electronic device operating temperature. The primary purpose of a heat dissipating component is to help maintain the device temperature below the maximum allowable temperature specified by its designer/manufacturer.

Typically, the heat sinks are formed of a metal, especially copper or aluminum, due to the ability of metals like copper to readily absorb heat and transfer it about its entire structure. Copper heat sinks are often formed with fins or other structures to increase the surface area of the heat sink, with air being forced across or through the fins (such as by a fan) to effect heat dissipation from the electronic component, through the copper heat sink and then to the air.

The use of copper or aluminum heat dissipating elements can present a problem because of the weight of the metal, particularly when the heat transmitting area of the heat dissipating component is significantly larger than that of the electronic device. For instance, pure copper weighs 8.96 grams per cubic centimeter ($g/cm^3$) and pure aluminum weighs 2.70 $g/cm^3$.

For example, in many applications, several heat sinks need to be arrayed on, e.g., a circuit board to dissipate heat from a variety of components on the board. If metallic heat sinks are employed, the sheer weight of the metal on the board can increase the chances of the board cracking or of other equally undesirable effects, and increases the weight of the component itself. For portable electronic devices, any method to reduce weight while maintaining heat dissipation characteristics is especially desirable.

One group of relatively light weight materials suitable for use in heat sinks are those materials generally known as graphites, but in particular graphites such as those based on natural graphites and flexible graphite as described below. These materials are anisotropic and allow the heat sink to be designed to preferentially transfer heat in selected directions. The graphite materials are much lighter in weight and thus provide many advantages over copper or aluminum.

Graphites are made up of layer planes of hexagonal arrays or networks of carbon atoms. These layer planes of hexagonally arranged carbon atoms are substantially flat and are oriented or ordered so as to be substantially parallel and equidistant to one another. The substantially flat, parallel equidistant sheets or layers of carbon atoms, usually referred to as graphene layers or basal planes, are linked or bonded together and groups thereof are arranged in crystallites. Highly ordered graphites consist of crystallites of considerable size: the crystallites being highly aligned or oriented with respect to each other and having well ordered carbon layers. In other words, highly ordered graphites have a high degree of preferred crystallite orientation. It should be noted that graphites possess anisotropic structures and thus exhibit or possess many properties that are highly directional e.g. thermal and electrical conductivity and fluid diffusion.

Briefly, graphites may be characterized as laminated structures of carbon, that is, structures consisting of superposed layers or laminae of carbon atoms joined together by weak van der Waals forces. In considering the graphite structure, two axes or directions are usually noted, to wit, the "c" axis or direction and the "a" axes or directions. For simplicity, the "c" axis or direction may be considered as the direction perpendicular to the carbon layers. The "a" axes or directions may be considered as the directions parallel to the carbon layers or the directions perpendicular to the "c" direction. The graphites suitable for manufacturing flexible graphite sheets possess a very high degree of orientation.

As noted above, the bonding forces holding the parallel layers of carbon atoms together are only weak van der Waals forces. Natural graphites can be treated so that the spacing between the superposed carbon layers or laminae can be appreciably opened up so as to provide a marked expansion in the direction perpendicular to the layers, that is, in the "c"

direction, and thus form an expanded or intumesced graphite structure in which the laminar character of the carbon layers is substantially retained.

Graphite flake which has been greatly expanded and more particularly expanded so as to have a final thickness or "c" direction dimension which is as much as about 80 or more times the original "c" direction dimension can be formed without the use of a binder into cohesive or integrated sheets of expanded graphite, e.g. webs, papers, strips, tapes, foils, mats or the like (typically referred to as "flexible graphite"). The formation of graphite particles which have been expanded to have a final thickness or "c" dimension which is as much as about 80 times or more the original "c" direction dimension into integrated flexible sheets by compression, without the use of any binding material, is believed to be possible due to the mechanical interlocking, or cohesion, which is achieved between the voluminously expanded graphite particles.

In addition to flexibility, the sheet material, as noted above, has also been found to possess a high degree of anisotropy with respect to thermal and electrical conductivity and fluid diffusion, comparable to the natural graphite starting material due to orientation of the expanded graphite particles and graphite layers substantially parallel to the opposed faces of the sheet resulting from very high compression, e.g. roll pressing. Sheet material thus produced has excellent flexibility, good strength and a very high degree of orientation.

Briefly, the process of producing flexible, binderless anisotropic graphite sheet material, e.g. web, paper, strip, tape, foil, mat, or the like, comprises compressing or compacting under a predetermined load and in the absence of a binder, expanded graphite particles which have a "c" direction dimension which is as much as about 80 or more times that of the original particles so as to form a substantially flat, flexible, integrated graphite sheet. The expanded graphite particles that generally are worm-like or vermiform in appearance, once compressed, will maintain the compression set and alignment with the opposed major surfaces of the sheet. The density and thickness of the sheet material can be varied by controlling the degree of compression. The density of the sheet material can be within the range of from about 0.04 g/cm$^3$ to about 2.0 g/cm$^3$. The flexible graphite sheet material exhibits an appreciable degree of anisotropy due to the alignment of graphite particles parallel to the major opposed, parallel surfaces of the sheet, with the degree of anisotropy increasing upon roll pressing of the sheet material to increase orientation. In roll pressed anisotropic sheet material, the thickness, i.e. the direction perpendicular to the opposed, parallel sheet surfaces comprises the "c" direction and the directions ranging along the length and width, i.e. along or parallel to the opposed, major surfaces comprises the "a" directions and the thermal, electrical and fluid diffusion properties of the sheet are very different, by orders of magnitude, for the "c" and "a" directions.

Another group of relatively light weight materials which has been used in heat sinks are the thermally conductive plastics such as those which have been introduced by ChipCool Inc. and Cool Polymers Inc., both of Warwick, R.I. Such thermally conductive plastics typically have thermal conductivities on the order of from about 5 to about 10 W/m° K, but reportedly some such plastics have thermal conductivities up to about 100 W/m° K. In many situations, however, thermally conductive plastic heat sinks cannot provide sufficient thermal conductivity to achieve the desired heat transfer capabilities while still providing a light weight heat sink.

Accordingly, there is a continuing need for improved designs for heat sinks that can provide thermal conductivity comparable to those of traditional aluminum heat sinks while providing substantial weight reductions.

SUMMARY OF THE INVENTION

The present invention provides an optimized heat sink design which uses a base made of a high thermal conductivity material and fins constructed of a relatively low thermal conductivity material.

In one embodiment the base is constructed of a material having a thermal conductivity of at least about 200 W/m° K in a plane of the base. The heat sink includes a plurality of fins constructed of thermally conductive plastic attached to the base to form a composite article.

In another embodiment of the invention the heat sink comprises a planar base constructed of anisotropic graphite sheet material having two axes of highest thermal conductivity oriented parallel to the plane of the base, and a plurality of fins constructed of thermally conductive plastic connected to the base.

In yet another embodiment of the invention a low profile composite heat sink apparatus comprises a base having a length, a width and a thickness (which can also be referred to as height), the base being constructed of an anisotropic graphite material having a higher thermal conductivity in the directions of the length and width than the graphite material has in the direction of the thickness, and a plurality of fins constructed of a material having a thermal conductivity in the plane of the fins of no greater than half that of the in-plane thermal conductivity of the base, preferably no greater than about 100 W/m° K. The fins preferably have a height above the base of no greater than about 3 times the thickness (height) of the base; More preferably no greater than about 1.5 times the thickness of the base, the fins are no greater than about 15 mm in height.

Accordingly, it is an object of the present invention to provide an improved heat sink design for thermal management of electronic devices.

Still another object of the present invention is the provision of relatively light weight heat sinks having cooling capability greater than that of a traditional solid aluminum heat sink.

And another object of the present invention is the provision of economical methods for construction of a composite heat sink apparatus.

Other and further objects, features, and advantages of the present invention will be readily apparent to those skilled in the art, upon a reading of the following disclosure when taken in conjunction with the accompanying drawings.

BRIEF DESCRIPTION OF THE DRAWINGS

FIG. 1 is a perspective view of a first embodiment of the present invention.

FIG. 2 is an elevation section view taken along line 2—2 of FIG. 1.

FIG. 3 is an elevation section view similar to that of FIG. 2, of an alternative embodiment showing the use of a high thermal conducting insert in the base of the heat sink.

FIG. 4 is an elevation section view similar to FIG. 2 showing another alternative embodiment wherein individual fins are set in grooves in the base.

FIG. 5 is an elevation section view similar to FIG. 2 showing still another alternative embodiment wherein an inverted fin set has the free ends of the fins received in grooves in the base.

DETAILED DESCRIPTION OF THE PREFERRED EMBODIMENTS

As noted, one material from which the heat sinks of the present invention may be constructed is graphite sheet material. Before describing the construction of the heat sinks, a brief description of graphite and its formation into flexible sheets is in order.

Preparation of Flexible Graphite Sheet

Graphite is a crystalline form of carbon comprising atoms covalently bonded in flat layered planes with weaker bonds between the planes. By treating particles of graphite, such as natural graphite flake, with an intercalant of, e.g. a solution of sulfuric and nitric acid, the crystal structure of the graphite reacts to form a compound of graphite and the intercalant. The treated particles of graphite are hereafter referred to as "particles of intercalated graphite." Upon exposure to high temperature, the intercalant within the graphite decomposes and volatilizes, causing the particles of intercalated graphite to expand in dimension as much as about 80 or more times its original volume in an accordion-like fashion in the "c" direction, i.e. in the direction perpendicular to the crystalline planes of the graphite. The exfoliated graphite particles are vermiform in appearance, and are therefore commonly referred to as worms. The worms may be compressed together into flexible sheets that, unlike the original graphite flakes, can be formed and cut into various shapes.

Graphite starting materials suitable for use in the present invention include highly graphitic carbonaceous materials capable of intercalating organic and inorganic acids as well as halogens and then expanding when exposed to heat. These highly graphitic carbonaceous materials most preferably have a degree of graphitization of about 1.0. As used in this disclosure, the term "degree of graphitization" refers to the value g according to the formula:

$$g = \frac{3.45 - d(002)}{0.095}$$

where d(002) is the spacing between the graphitic layers of the carbons in the crystal structure measured in Angstrom units. The spacing d between graphite layers is measured by standard X-ray diffraction techniques. The positions of diffraction peaks corresponding to the (002), (004) and (006) Miller Indices are measured, and standard least-squares techniques are employed to derive spacing which minimizes the total error for all of these peaks. Examples of highly graphitic carbonaceous materials include natural graphites from various sources, as well as other carbonaceous materials such as graphite prepared by chemical vapor deposition, high temperature pyrolysis of polymers, or crystallization from molten metal solutions and the like. Natural graphite is most preferred.

The graphite starting materials used in the present invention may contain non-graphite components so long as the crystal structure of the starting materials maintains the required degree of graphitization and they are capable of exfoliation. Generally, any carbon-containing material, the crystal structure of which possesses the required degree of graphitization and which can be exfoliated, is suitable for use with the present invention. Such graphite preferably has a purity of at least about eighty weight percent. More preferably, the graphite employed for the present invention will have a purity of at least about 94%. In the most preferred embodiment, the graphite employed will have a purity of at least about 98%.

A common method for manufacturing graphite sheet is described by Shane et al. in U.S. Pat. No. 3,404,061, the disclosure of which is incorporated herein by reference. In the typical practice of the Shane et al. method, natural graphite flakes are intercalated by dispersing the flakes in a solution containing e.g., a mixture of nitric and sulfuric acid, advantageously at a level of about 20 to about 300 parts by weight of intercalant solution per 100 parts by weight of graphite flakes (pph). The intercalation solution contains oxidizing and other intercalating agents known in the art. Examples include those containing oxidizing agents and oxidizing mixtures, such as solutions containing nitric acid, potassium chlorate, chromic acid, potassium permanganate, potassium chromate, potassium dichromate, perchloric acid, and the like, or mixtures, such as for example, concentrated nitric acid and chlorate, chromic acid and phosphoric acid, sulfuric acid and nitric acid, or mixtures of a strong organic acid, e.g. trifluoroacetic acid, and a strong oxidizing agent soluble in the organic acid. Alternatively, an electric potential can be used to bring about oxidation of the graphite. Chemical species that can be introduced into the graphite crystal using electrolytic oxidation include sulfuric acid as well as other acids.

In a preferred embodiment, the intercalating agent is a solution of a mixture of sulfuric acid, or sulfuric acid and phosphoric acid, and an oxidizing agent, i.e. nitric acid, perchloric acid, chromic acid, potassium permanganate, hydrogen peroxide, iodic or periodic acids, or the like. Although less preferred, the intercalation solution may contain metal halides such as ferric chloride, and ferric chloride mixed with sulfuric acid, or a halide, such as bromine as a solution of bromine and sulfuric acid or bromine in an organic solvent.

The quantity of intercalation solution may range from about 20 to about 350 pph and more typically about 40 to about 160 pph. After the flakes are intercalated, any excess solution is drained from the flakes and the flakes are water-washed. Alternatively, the quantity of the intercalation solution may be limited to between about 10 and about 40 pph, which permits the washing step to be eliminated as taught and described in U.S. Pat. No. 4,895,713, the disclosure of which is also herein incorporated by reference.

The particles of graphite flake treated with intercalation solution can optionally be contacted, e.g. by blending, with a reducing organic agent selected from alcohols, sugars, aldehydes and esters which are reactive with the surface film of oxidizing intercalating solution at temperatures in the range of 25° C. and 125° C. Suitable specific organic agents include hexadecanol, octadecanol, 1-octanol, 2-octanol, decylalcohol, 1, 10 decanediol, decylaldehyde, 1-propanol, 1,3 propanediol, ethyleneglycol, polypropylene glycol, dextrose, fructose, lactose, sucrose, potato starch, ethylene glycol monostearate, diethylene glycol dibenzoate, propylene glycol monostearate, glycerol monostearate, dimethyl oxylate, diethyl oxylate, methyl formate, ethyl formate, ascorbic acid and lignin-derived compounds, such as sodium lignosulfate. The amount of organic reducing agent is suitably from about 0.5 to 4% by weight of the particles of graphite flake.

The use of an expansion aid applied prior to, during or immediately after intercalation can also provide improvements. Among these improvements can be reduced exfoliation temperature and increased expanded volume (also referred to as "worm volume"). An expansion aid in this context will advantageously be an organic material sufficiently soluble in the intercalation solution to achieve an improvement in expansion. More narrowly, organic materials of this type that contain carbon, hydrogen and oxygen, preferably exclusively, may be employed. Carboxylic acids have been found especially effective. A suitable carboxylic acid useful as the expansion aid can be selected from aromatic, aliphatic or cycloaliphatic, straight chain or branched chain, saturated and unsaturated monocarboxylic acids, dicarboxylic acids and polycarboxylic acids which have at least 1 carbon atom, and preferably up to about 15 carbon atoms, which is soluble in the intercalation solution in amounts effective to provide a measurable improvement of one or more aspects of exfoliation. Suitable organic solvents can be employed to improve solubility of an organic expansion aid in the intercalation solution.

Representative examples of saturated aliphatic carboxylic acids are acids such as those of the formula $H(CH_2)_n COOH$ wherein n is a number of from 0 to about 5, including formic, acetic, propionic, butyric, pentanoic, hexanoic, and the like. In place of the carboxylic acids, the anhydrides or reactive carboxylic acid derivatives such as alkyl esters can also be employed. Representative of alkyl esters are methyl formate and ethyl formate. Sulfuric acid, nitric acid and other known aqueous intercalants have the ability to decompose formic acid, ultimately to water and carbon dioxide. Because of this, formic acid and other sensitive expansion aids are advantageously contacted with the graphite flake prior to immersion of the flake in aqueous intercalant. Representative of dicarboxylic acids are aliphatic dicarboxylic acids having 2–12 carbon atoms, in particular oxalic acid, fumaric acid, malonic acid, maleic acid, succinic acid, glutaric acid, adipic acid, 1,5-pentanedicarboxylic acid, 1,6-hexanedicarboxylic acid, 1,10-decanedicarboxylic acid, cyclohexane-1,4-dicarboxylic acid and aromatic dicarboxylic acids such as phthalic acid or terephthalic acid. Representative of alkyl esters are dimethyl oxylate and diethyl oxylate. Representative of cycloaliphatic acids is cyclohexane carboxylic acid and of aromatic carboxylic acids are benzoic acid, naphthoic acid, anthranilic acid, p-aminobenzoic acid, salicylic acid, o-, m- and p-tolyl acids, methoxy and ethoxybenzoic acids, acetoacetamidobenzoic acids and, acetamidobenzoic acids, phenylacetic acid and naphthoic acids. Representative of hydroxy aromatic acids are hydroxybenzoic acid, 3-hydroxy-1-naphthoic acid, 3-hydroxy-2-naphthoic acid, 4-hydroxy-2-naphthoic acid, 5-hydroxy-1-naphthoic acid, 5-hydroxy-2-naphthoic acid, 6-hydroxy-2-naphthoic acid and 7-hydroxy-2-naphthoic acid. Prominent among the polycarboxylic acids is citric acid.

The intercalation solution will be aqueous and will preferably contain an amount of expansion aid of from about 1 to 10%, the amount being effective to enhance exfoliation. In the embodiment wherein the expansion aid is contacted with the graphite flake prior to or after immersing in the aqueous intercalation solution, the expansion aid can be admixed with the graphite by suitable means, such as a V-blender, typically in an amount of from about 0.2% to about 10% by weight of the graphite flake.

After intercalating the graphite flake, and following the blending of the intercalant coated intercalated graphite flake with the organic reducing agent, the blend is exposed to temperatures in the range of 25° to 125° C. to promote reaction of the reducing agent and intercalant coating. The heating period is up to about 20 hours, with shorter heating periods, e.g., at least about 10 minutes, for higher temperatures in the above-noted range. Times of one half hour or less, e.g., on the order of 10 to 25 minutes, can be employed at the higher temperatures.

The thus treated particles of graphite are sometimes referred to as "particles of intercalated graphite." Upon exposure to high temperature, e.g. temperatures of at least about 160° C. and especially about 700° C. to 1000° C. and higher, the particles of intercalated graphite expand as much as about 80 to 1000 or more times their original volume in an accordion-like fashion in the c-direction, i.e. in the direction perpendicular to the crystalline planes of the constituent graphite particles. The expanded, i.e. exfoliated, graphite particles are vermiform in appearance, and are therefore commonly referred to as worms. The worms may be compressed together into flexible sheets that, unlike the original graphite flakes, can be formed and cut into various shapes.

Flexible graphite sheet and foil are coherent, with good handling strength, and are suitably compressed, e.g. by roll pressing, to a thickness of about 0.075 mm to 3.75 mm and a typical density of about 0.1 to 1.5 grams per cubic centimeter ($g/cm^3$). From about 1.5–30% by weight of ceramic additives can be blended with the intercalated graphite flakes as described in U.S. Pat. No. 5,902,762 (which is incorporated herein by reference) to provide enhanced resin impregnation in the final flexible graphite product. The additives include ceramic fiber particles having a length of about 0.15 to 1.5 millimeters. The width of the particles is suitably from about 0.04 to 0.004 mm. The ceramic fiber particles are non-reactive and non-adhering to graphite and are stable at temperatures up to about 1100° C., preferably about 1400° C. or higher. Suitable ceramic fiber particles are formed of macerated quartz glass fibers, carbon and graphite fibers, zirconia, boron nitride, silicon carbide and magnesia fibers, naturally occurring mineral fibers such as calcium metasilicate fibers, calcium aluminum silicate fibers, aluminum oxide fibers and the like.

The flexible graphite sheet can also, at times, be advantageously treated with resin and the absorbed resin, after curing, enhances the moisture resistance and handling strength, i.e. stiffness, of the flexible graphite sheet as well as "fixing" the morphology of the sheet. Suitable resin content is preferably less than about 60% by weight, more preferably less than about 35% by weight, and most preferably from about 4% to about 15% by weight. Resins found especially useful in the practice of the present invention include acrylic-, epoxy- and phenolic-based resin systems, or mixtures thereof. Suitable epoxy resin systems include those based on diglycidyl ether or bisphenol A (DGEBA) and other multifunctional resin systems; phenolic resins that can be employed include resole and novolak phenolics.

Preparation of Laminated Graphite Materials

When using graphite material for the base of the heat sink, that graphite material is preferably constructed from a laminated resin impregnated graphite material in the manner set forth in U.S. patent application Ser. No. 09/943,131, filed Aug. 31, 2001 of Norley et al. entitled "LAMINATES PREPARED FROM IMPREGNATED FLEXIBLE GRAPHITE SHEETS", assigned to the assignee of the present invention, the details of which are incorporated herein by reference.

According to the Norley et al. process, flexible graphite sheets prepared as described above and having a thickness of about 4 mm to 7 mm are impregnated with a resin such as an epoxy, acrylic or phenolic resin system. Suitable epoxy resins include diglycidyl ether of bisphenol A (DGEBA) resin systems; other multifunctional epoxy resins systems are also suitable for use in the present invention. Suitable phenolic resin systems include those containing resole and novolak resins. The sheets are then calendered to a thickness of about 0.35 mm to 0.5 mm, at which time the calendered, epoxy impregnated flexible mats have a density of about 1.4 g/cm$^3$ to about 1.9 g/cm$^3$.

The amount of resin within the impregnated graphite sheets should be an amount sufficient to ensure that the final assembled and cured layered structure is dense and cohesive, yet the anisotropic thermal conductivity associated with a densified graphite structure has not been adversely impacted. Suitable resin content is preferably at least about 3% by weight, more preferably from about 5% to about 35% by weight depending on the characteristics desired in the final product.

In a typical resin impregnation step, the flexible graphite sheet is passed through a vessel and impregnated with the resin system from, e.g. spray nozzles, the resin system advantageously being "pulled through the mat" by means of a vacuum chamber. Typically, but not necessarily, the resin system is solvated to facilitate application into the flexible graphite sheet. The resin is thereafter preferably dried, reducing the tack of the resin and the resin-impregnated sheet.

One type of apparatus for continuously forming resin-impregnated and calendered flexible graphite sheet is shown in International Publication No. WO 00/64808, the disclosure of which is incorporated herein by reference.

Following the calendering step, the impregnated sheets are cut to suitable-sized pieces which are stacked together and placed in a press, where they are cured at an elevated temperature and pressure. The temperature should be sufficient to ensure that the lamellar structure is densified at the curing pressure, improving the anisotropy of the structure and hence its thermal properties as a heat dissipating device. Generally, this will require a temperature of from about 50° C. to 200° C. The pressure employed for curing will be somewhat a function of the temperature utilized, but will be sufficient to ensure that the lamellar structure is densified without adversely impacting the thermal properties of the structure. Generally, for convenience of manufacture, the minimum required pressure to densify the structure to the required degree will be utilized. Such a pressure will generally be from 1000 to 5000 pounds per square inch (psi). The curing time may vary depending on the resin system and the temperature and pressure employed, but generally will range from 0.5 hours to 2 hours. After curing is complete, the composites are seen to have a density of from about 1.8 g/cm$^3$ to 2.0 g/cm$^3$.

Advantageously, the resin present in the impregnated sheets can act as the adhesive for the composite material. Alternatively the calendered, impregnated, flexible graphite sheets are coated with an adhesive before the flexible sheets are stacked and cured. Suitable adhesives include epoxy-, acrylic- and phenolic-based resins. Phenolic resins found especially useful in the practice of the present invention include phenolic-based resin systems including resole and novolak phenolics.

Optionally, non-graphite layers may be included in the pre-pressed stack. Such non-graphite layers may include metals, plastics or other non-metallics such as fiberglass or ceramics. The epoxy polymer in the impregnated graphite sheets is sufficient to, upon curing, adhesively bond the non-graphite as well as the impregnated graphite layers of the structure into place.

The following example is presented to further illustrate and explain the construction of suitable laminated structures and is not intended to be limiting in any regard. Unless otherwise indicated, all parts and percentages are by weight.

EXAMPLE

Graphite sheets with a weight per unit area of 70 mg/cm$^2$ with dimensions of approximately 30 cm by 30 cm were impregnated with epoxy such that the resulting calendered mats were 12 weight % epoxy. The epoxy employed was a diglycidyl ether of bisphenol A (DGEBA) elevated temperature cure formulation and the impregnation procedures involved saturation with an acetone-resin solution followed by drying at approximately 80° C. Following impregnation, the sheets were then calendered from a thickness of approximately 7 mm to a thickness of approximately 0.4 mm and a density of 1.63 g/cm$^3$. The calendered, impregnated sheets were then cut into disks with a diameter of approximately 50 mm and the disks were stacked 46 layers high. This stack of disks was then placed in a TMP (Technical Machine Products) press, and cured at 2600 psi at 150° C. for 1 hour. The resultant laminate had a density of 1.90 g/cm$^3$, a flexural strength of 8000 psi, a Young's modules of 7.5 Msi (millions of pounds per square inch) and an in plane resistivity of 6 microhm. The in-plane and through-thickness thermal conductivity values were 396 W/m° C. and 6.9 W/m° C., respectively. The laminates exhibited superior machinability, had a continuous pore free surface with a smooth finish and were suitable for use in electronic thermal management devices. The highly anisotropic thermal conductivity resulted in a structure highly adapted for use in piping heat away from sensitive electronics and into a heat sink. In addition, the density of the material, approximately 1.94 g/cm$^3$, is considerably below aluminum (2.7 g/cm$^3$) and much less than copper (8.96 g/cm$^3$). Thus, the specific thermal conductivity (that is, the ratio of thermal conductivity to density) of the graphite laminate is about three times that of aluminum and about four to six times that of copper.

The laminated graphite materials suitable for use with the present invention are not limited to those specific ones described above, and may for example include a laminate comprised of layers of pyrolytic graphite sheet such as that manufactured by Matsushita Electric Components Co., Ltd. Ceramic Division, 1006 Kadoma, Osaka, Japan under the trade name Panasonic "PGS" ® Graphite Sheet.

Use of Inserts in a Graphite Base

When using graphite material for the heat sink, the transfer of heat from the heat source into the base of the heat sink may be enhanced by providing a high thermal conductivity insert in the base in a manner like that described in U.S. patent application Ser. No. 10/015,549, entitled HEAT DISSIPATING COMPONENT USING HIGH CONDUCTING INSERTS, filed Dec. 13, 2001 by Krassowski et al. the details of which are incorporated herein by reference. A cavity is formed through the thickness of the base and the high conductivity insert is received in the cavity. The insert may be an isotropic high thermal conductivity material such as copper or an anisotropic material such as graphite oriented to have high conductivity in the direction of the thickness of the base.

The Detailed Embodiment of FIGS. 1–4

Referring now to the drawings, and particularly to FIGS. 1 and 2, a first embodiment of the heat sink apparatus of the present invention is shown and generally designated by the numeral 10. The heat sink 10 includes a base 12 and a plurality of fins 14. In the embodiment of FIGS. 1 and 2, the fins 14 are part of an integral fin set 16 which includes the fins 14 and a web 18 joining the fins. The web 18 is bonded to the base 12 by an adhesive layer 20 to provide a thermally conductive attachment of the fins 14 to the base 12.

The heat sink 10 may be constructed for use in either a forced convection or a natural convection context.

In order to provide a high performance yet light weight heat sink apparatus, the base 12 is constructed from a first relatively high thermal conductivity material, and the fins 14 are constructed of a second relatively low thermal conductivity material which is much lighter in weight than typical metal or copper fins.

This arrangement is particularly useful in low profile heat sinks, that is heat sinks having a fin height 22 above the base 12 of no greater than about 15 mm, and preferably in a range of from about 5 mm to about 10 mm. In such a low profile heat sink apparatus it has been discovered that it is not critical for the fins themselves to be constructed of a high thermal conductivity material, because the fins due to their relatively low height do not contribute greatly to the heat dissipating characteristics of the heat sink apparatus. On the other hand, it has been discovered that for such low profile heat sink apparatus it is important for the base itself to have a high thermal conductivity in the plane of the base.

The present invention develops a good performing low profile heat sink with lower cost and lower weight than conventional heat sinks made from copper and aluminum, by using a high thermal conducting material for the base 12, and a much lower thermal conducting but lighter weight material for the fins 14.

The base 12 can be described as having a length 24, a width 26, and a thickness 28 less than the length and width 24 and 26.

The base 12 may be made of any suitable high thermal conductivity material, but preferably is made from a material selected from the group consisting of copper, aluminum and graphite.

The graphite material is preferably anisotropic graphite sheet material of the type described above. Furthermore, when utilizing anisotropic graphite sheet material for the base 12, the high thermal conductivity axes of the material are oriented in the plane of the base, that is parallel to a plane generally defined by the length 24 and width 26.

Furthermore, when utilizing flexible graphite sheet material for the base 12, the base is preferably constructed in accordance with the teachings of Krassowski et al. U.S. patent application Ser. No. 10/015,549. This construction is illustrated in FIG. 3 wherein the base 12A has a cavity 30 defined therein within which is received a core or insert 32. The core 32 is preferably constructed from copper, aluminum or other high thermal conductivity material, which may also be graphite sheet material with its high thermal conductivity axes oriented parallel to the thickness 28 of the base 12. These high conductivity thermal materials may be described as having a thermal conductivity in the direction of the thickness 28 of the base 12 greater than about 200 W/m° K. The core 32 is tightly received within the cavity 30 and may either be bonded thereto or may be shrunk fit. When using the insert 32, the electronic device 36 which is being cooled is typically bonded to the lower surface of the insert 32. A suitable thermal interface may be provided therebetween.

The fins 14 may be constructed of any relatively light weight thermal conducting material, but preferably are constructed from a thermally conductive plastic such as CoolPoly™ polymers available from Cool Polymers Inc. of Warwick, R.I. These materials have thermal conductivities typically in the range of 5 to 10 W/m° K, but sometimes ranging up to as high as 100 W/m° K.

Such plastic materials may also have thermally conductive additives included in the plastic.

Other suitable fin materials would include any relatively lightweight material that has a thermal conductivity of at least about 5 W/m° K. Such relatively lightweight materials should be substantially lighter than aluminum. For example, most plastics have a density of less than 1.0 gm/cc, as compared to aluminum which has a density of 2.7 gm/cc. Even when conductive additives are included in the plastic it will have a density no greater than about one-half that of aluminum, i.e. no greater than about 1.35 gm/cc.

The fin materials utilized with the present invention will preferably have a thermal conductivity of less than about 100 W/m° K, more preferably less than about 50 W/m° K, and most preferably in the range of from about 5 W/m° K to about 30 W/m° K.

One advantage of the plastic materials is that they may be easily molded into a fin set like fin set 16. Such materials can be extruded in long strips and then cut to length and adhered to the base material in a very economical fashion. Also the moldability of plastic allows heat sinks of complex shapes to be easily formed. For example, the heat sink could have fins arranged in concentric circles. It is also noted that in the case of heat sinks having complex shapes, it is not necessary that the base be rectangular in shape, but instead the base can have a complex shape.

In another alternative embodiment shown in FIG. 4, the heat sink apparatus is designated by the numeral 10B, and includes a base 12B having a plurality of grooves 34 defined therein, within which are received individual fins 14B. The individual fins may be held in place within the grooves 34 by a suitable chemical adhesive, or by a shrink fit. In the embodiment of FIG. 4, the base 12B includes an insert 32B which functions similarly to the insert 32A of FIG. 3. The base 12B is preferably constructed from anisotropic graphite material as previously described.

FIG. 5 shows another alternative embodiment designated by the numeral 10C. Heat sink 10C includes a base 12C having a plurality of grooves 34 defined therein. An inverted finset 16C has the free ends of the fins received in grooves 34, and the web 18C is located away from base 12C. The free ends of fins 14C may be held in place within the grooves 34 by a suitable chemical adhesive, or by a shrink fit. As compared to the embodiment of FIG. 4, this arrangement provides better mechanical integrity and better heat flow into the fins. It is also easier to assemble than using individual fins. In some instances, this arrangement could also help direct airflow through the fins, leading to more efficient cooling.

In general any of the heat sink apparatus of FIGS. 1 through 5 may be described as having a base 12 constructed of a material having a thermal conductivity of at least as great as about 200 W/m° K. in a plane of the base, and having a plurality of fins 14 constructed of thermally conductive plastic, the fins being attached to the base 12 to form a composite apparatus 10.

We have discovered that particularly in the case of relatively low profile heat sinks, that is heat sinks having a fin height of no greater than about 15 mm, the contribution of the thermal conductivity of the fins to the overall cooling capability is relatively modest as compared to that of the base. Thus, by providing a relatively high thermal conductivity base, a light weight but relatively low thermal conductivity material can be utilized for the fins and still provide a composite heat sink apparatus that is superior in overall performance to a conventional all aluminum heat sink, while being lighter in weight.

The following Table I provides numerical modeling data which compares the performance of various combinations of base and fins, for a low profile heat sink having a fin height of 7 mm.

In Table I, Case No. 1 was modeled as an all-plastic heat sink. Case No. 2 was modeled as having a plastic base with either copper or graphite fins, simply as a comparison to show the effect of changing materials. Case No. 3 is the present invention having a graphite base with insert 32 as shown in FIG. 3, or having a copper base, and utilizing plastic fins. Case No. 4 models a copper base with aluminum fins. Case No. 5 models an all-copper heat sink. Case No. 6 models an all-aluminum heat sink.

As seen in Table I the present invention shown as Case No. 3 provided maximum temperature $T_{max}$ of 69.75° C. which was superior to that shown for the all aluminum heat sink of similar dimensions represented by Case No. 6 which had a $T_{max}$ of 71.44° C.

TABLE I

| Case No. | Thermal Conductivity (W/m° K) | | $T_{max}$ (° C.) | Remarks |
| --- | --- | --- | --- | --- |
| | Base | Fin | | |
| 1 | 10 | 10 | 219.36 | All-Plastic Heat Sink |
| 2 | | 400 | 148.27 | Graphite or Copper Fins - Plastic Base |
| 3 | | 10 | 69.75 | Graphite or Copper Base - Plastic Fins |
| 4 | 400 | 209 | 67.07 | Copper Base-Aluminum Fins |
| 5 | | 400 | 66.59 | All Copper Heat Sink |
| 6 | 209 | 209 | 71.44 | All-Aluminum Heat Sink |

Table II shows a similar comparison for a high profile heat sink apparatus having a fin height of 40 mm. In Table II, Case No. 7 models an all-plastic heat sink. Case No. 8 models a heat sink having a plastic base with either graphite or copper fins. Case No. 9 models the present invention having a graphite base or a copper base with plastic fins. Case No. 10 models an all-copper heat sink. Case No. 11 models an all-aluminum heat sink.

As is seen in Table II, in Case No. 9, the maximum temperature for a graphite base/plastic fin heat sink now exceeds that of an all-aluminum heat sink as shown in Case No. 11.

TABLE II

| Case No. | Thermal Conductivity (W/m° K) | | $T_{max}$ (° C.) | Remarks |
| --- | --- | --- | --- | --- |
| | Base | Fin | | |
| 7 | 10 | 10 | 198.3 | All-Plastic Heat Sink |
| 8 | | 400 | 114.6 | Graphite or Copper Fins - Plastic Base |
| 9 | 400 | 10 | 60.4 | Graphite or Copper Base-Plastic Fins |
| 10 | | 400 | 48.6 | All Copper Heat Sink |
| 11 | 209 | 209 | 53.0 | All-Aluminum Heat Sink |

The heat sink modeled in Tables I and II had a length 24 of 115 mm, a width 26 of 70 mm, a base thickness 28 of 3 mm, a total of 14 fins having fin thickness of 1.0 mm, a spacing between fins of 4 mm, and a fin height 22 of 7 mm in Table I and 40 mm in Table II. The heat source 36 was modeled as having a size of 12 mm by 8 mm and having a power output of 25 W. The heat sink was modeled using computational fluid dynamic modeling.

As shown when comparing the present invention in Case No. 3 of Table I for a low profile heat sink, to similar materials in Case No. 9 for a high profile heat sink, it is seen that for the low profile case the graphite base with plastic fin arrangement of the present invention as shown in Case No. 3 outperformed a conventional all-aluminum heat sink as shown in Case No. 6. For the high profile heat sinks of Table II, however, a comparison of Cases 9 and 11 shows that this improved performance was no longer achievable.

Although the dividing line on fin height between those situations in which the composite graphite base/plastic fin heat sink will out-perform an all-aluminum heat sink will vary somewhat, in general those low profile heat sinks wherein the high thermal conductivity base, low thermal conductivity plastic fin arrangement is most advantageous can be described as having a fin height less than about 15 mm.

Further, it is noted that in the broadest aspects of the present invention it is not required that the composite heat sink have a performance better than that of an all aluminum heat sink of the same dimensions. There is a trade off of weight versus performance, even for designs wherein the fin height is such that thermal performance is not as great as that of an all aluminum heat sink. Thus in some situations thermal performance somewhat less than that of an all aluminum heat sink may be acceptable in order to also enjoy the advantages of reduced weight provided by the composite heat sink.

It is also within the broadest concepts of the present invention to utilize an aluminum base with plastic fins.

Thus it is seen that the apparatus of the present invention readily achieves the ends and advantages mentioned as well as those inherent therein. While certain preferred embodiments have been illustrated and described for purposes of the present disclosure, numerous changes may be made by those skilled in the art which changes are encompassed within the scope and spirit of the present invention as defined by the appended claims.

What is claimed is:

1. A low profile composite heat sink apparatus, comprising:

a base having a length, a width and a thickness, the base being constructed of an anisotropic graphite material having a higher thermal conductivity in the directions of the length and width than the graphite material has in the direction of the thickness; and a plurality of fins constructed of a material having a thermal conductivity in the plane of the fins of less than about 100 W/m° K, the fins having a height above the base of no greater than about 3 times the height of the base.

2. The apparatus of claim 1, wherein:
the fins are constructed of a thermally conductive plastic material.

3. The apparatus of claim 1, wherein:
the fins have a height above the base in a range of no greater than about 15 mm.

* * * * *